United States Patent
Lee et al.

(10) Patent No.: US 7,292,102 B2
(45) Date of Patent: Nov. 6, 2007

(54) GAIN CONTROL SCHEME INDEPENDENT OF PROCESS, VOLTAGE AND TEMPERATURE

(75) Inventors: C. Paul Lee, San Diego, CA (US); Arya Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 199 days.

(21) Appl. No.: 11/167,359

(22) Filed: Jun. 27, 2005

(65) Prior Publication Data

US 2006/0055461 A1    Mar. 16, 2006

Related U.S. Application Data

(60) Provisional application No. 60/609,178, filed on Sep. 10, 2004.

(51) Int. Cl.
*H03F 3/45* (2006.01)
(52) U.S. Cl. .................. 330/254; 330/253; 330/311

(58) Field of Classification Search ............... 330/253, 330/254, 311
See application file for complete search history.

(56) References Cited

U.S. PATENT DOCUMENTS

| | | | | | |
|---|---|---|---|---|---|
| 3,988,598 | A | * | 10/1976 | Ishigaki et al. | 327/423 |
| 5,198,780 | A | * | 3/1993 | Kase | 330/254 |
| 5,210,504 | A | * | 5/1993 | Yagita et al. | 330/253 |
| 5,889,432 | A | * | 3/1999 | Ho | 330/253 |
| 6,737,919 | B2 | * | 5/2004 | Cyrusian | 330/253 |
| 7,109,794 | B2 | * | 9/2006 | Killat | 330/253 |

OTHER PUBLICATIONS

"5-GHz CMOS Radio Transceiver Front-End Chipset"; Ting-Ping Liu et al.; IEEE Journal of Solid-State Circuits, vol. 35, No. 12; Dec. 2000; pp. 1927-1933.

* cited by examiner

*Primary Examiner*—Patricia Nguyen
(74) *Attorney, Agent, or Firm*—Garlick Harrison & Markison

(57) ABSTRACT

An apparatus and method to use a shunt network across source terminals of cascode transistors that drive a differential current to control gain. When the gates of the cascode transistors and transistors of the shunt network are activated by a same bias voltage, the gain control is substantially independent of process, voltage and temperature variations.

15 Claims, 8 Drawing Sheets

GAIN CONTROL SCHEME INDEPENDENT OF PROCESS, VOLTAGE AND TEMPERATURE

CROSS REFERENCE TO RELATED APPLICATION

This application claims the benefit of priority to U.S. Provisional Patent Application Ser. No. 60/609,178; filed Sep. 10, 2004; and titled "Gain Control Scheme Independent Of Process, Voltage And Temperature," which is incorporated herein by reference.

BACKGROUND OF THE INVENTION

1. Technical Field of the Invention

The embodiments of the invention relate to communication devices and more particularly to a gain control scheme for a differential amplifier.

2. Description of Related Art

Communication systems are known to support wireless and wire lined communications between wireless and/or wire lined communication devices. Such communication systems range from national and/or international cellular telephone systems to the Internet to point-to-point in-home wireless networks. Communication systems typically operate in accordance with one or more communication standards. For instance, wired communication systems may operate according to one or more versions of the Ethernet standard, the System Packet Interface (SPI) standard, or various other standards. Wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). Typically, the transceiver includes a data modulation stage and an RF stage. The data modulation stage (baseband process) converts between data and baseband signals in accordance with the particular wireless communication standard. The RF stage (transmitter section and receiver section) converts between baseband signals and RF signals. The RF stage may be a direct conversion transceiver that converts directly between baseband and RF or may include one or more intermediate frequency stages.

Wireless communication devices utilize gain control circuitry to provide control over amplification. One type of gain control circuitry incorporates differential amplifiers. For example, a Gilbert cell mixer may employ such differential amplification stage or stages where gain may be adjusted. Although there are variety of techniques to adjust gain, many amplifiers are not consistent over a range of operations. For example, when integrated devices are manufactured, the process variations from chip to chip may introduce inconsistencies in circuit operation. Furthermore, supply voltage variations during operation may introduce inconsistencies that affect amplifier operations. Temperature variations may also impact consistent operation of the circuit.

Process, voltage and temperature (as they pertain to circuit operation) are commonly referred to as PVT and changes in one or more of the PVT characteristics may change over an acceptable operating range of a circuit. Generally, it is desirable to obtain a circuit response that is independent of PVT so that variations of PVT cause little or no change in the operational characteristics of the circuit. In tight gain controlled amplifier circuits, the gain of the amplifier may remain substantially constant over the operational range of the amplifier, if the amplifier is made to respond independent of PVT.

Accordingly, it would be advantageous to implement a gain control scheme independent of process, voltage and temperature effects.

SUMMARY OF THE INVENTION

The present invention is directed to apparatus and methods of operation that are further described in the following Brief Description of the Drawings, the Detailed Description of the Embodiments of the Invention, and the Claims. Other features and advantages related to the embodiments of the present invention will become apparent from the following detailed description of the embodiments of the invention made with reference to the accompanying drawings.

In one embodiment of the invention, a driver circuit has at least a pair of transistors disposed in a cascode arrangement to receive differential driver current. A shunt network is coupled across the source terminals of the pair of cascode transistors to operate as a current divider to divert a portion of the differential driver current away from the pair of cascode transistors. An amount of current diverted to the shunt network operates to control gain of the driver. When the gate terminals of the cascode transistors, as well as transistor or transistors of the shunt network, are coupled together to receive a bias voltage, the circuit response is substantially independent of process, voltage and temperature variations.

DETAILED DESCRIPTION OF THE EMBODIMENTS OF THE INVENTION

The embodiments of the present invention may be practiced in a variety of settings that implement a differential amplifier that employs gain control.

Figure 1:
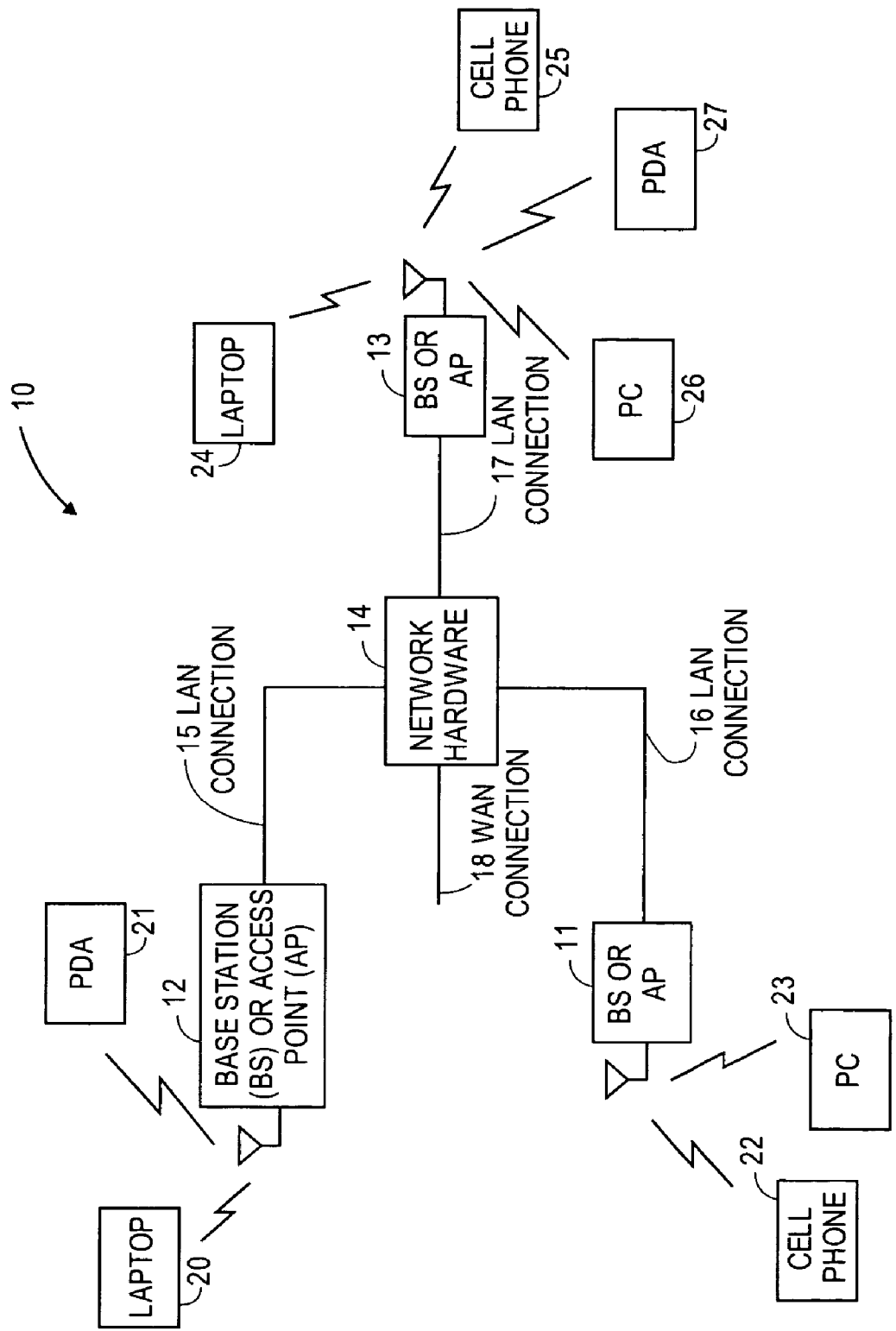
FIG. 1 is a block schematic diagram illustrating a wireless communication system in accordance with one embodiment of the present invention.

FIG. 1 is a schematic block diagram illustrating a communication system 10 that includes a plurality of base stations (BS) and/or access points (AP) 11-13, a plurality of wireless communication devices 20-27 and a network hardware component 14. Wireless communication devices 20-27 may be laptop host computers 20 and 24, personal digital assistant hosts 21 and 27, personal computer hosts 23 and 26, cellular telephone hosts 22 and 25, and/or any other type of device that supports wireless communications. The details of the wireless communication devices will be described with reference to FIG. 2.

Base stations or access points 11-13 may be operably coupled to network hardware 14 via respective local area network (LAN) connections 15-17. Network hardware 14, which may be a router, switch, bridge, modem, system controller, et cetera, may provide a wide area network (WAN) connection 18 for communication system 10. Individual base station or access point 11-13 generally has an associated antenna or antenna array to communicate with the wireless communication devices in its area. Typically, the wireless communication devices register with a particular base station or access point 11-13 to receive services within communication system 10. For direct connections (i.e., point-to-point communications), wireless communication devices may communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifiers and/or programmable multi-stage amplifiers to enhance performance, reduce costs, reduce size, and/or enhance broadband applications.

Figure 2:
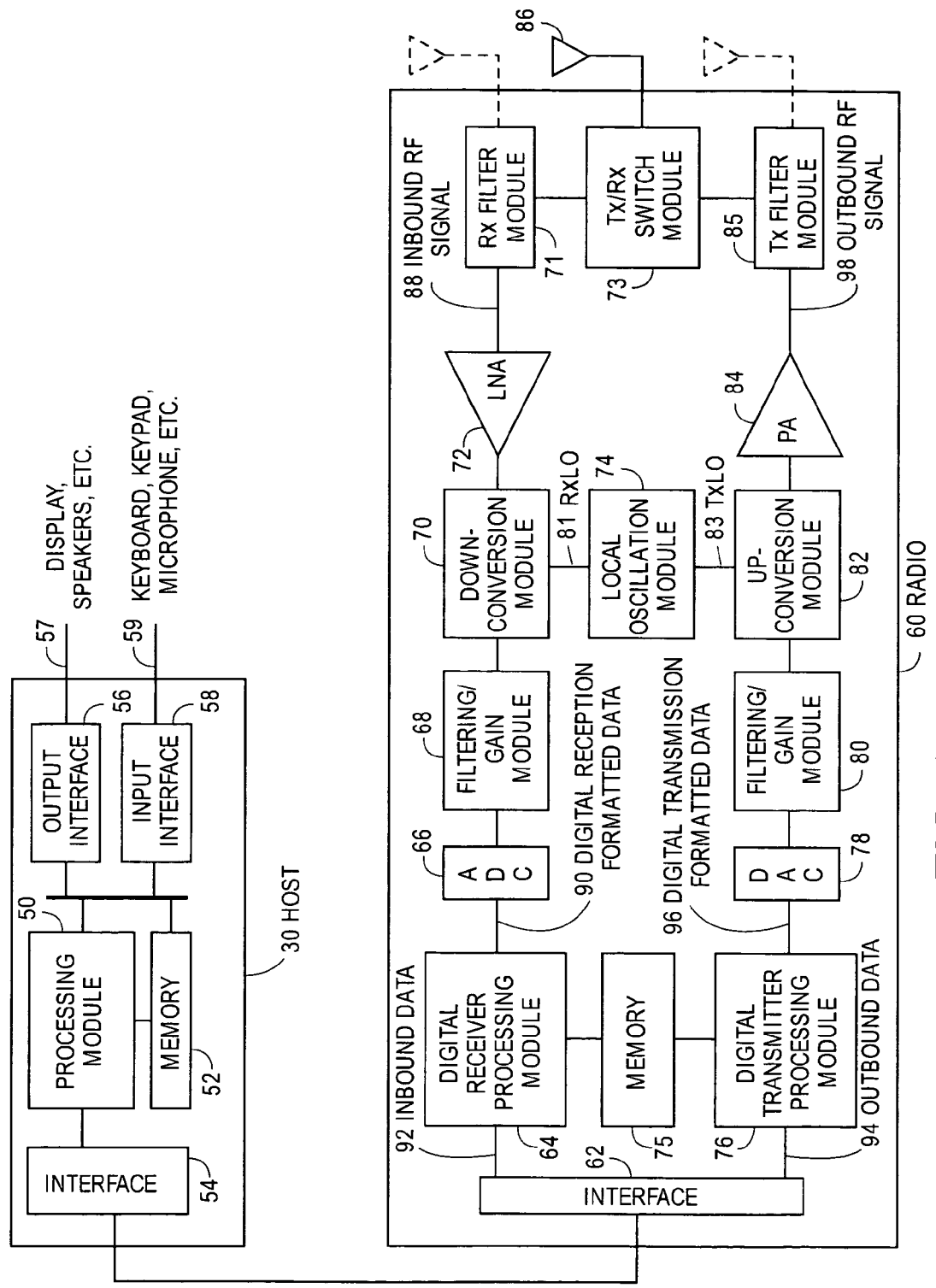
FIG. 2 is a schematic block diagram illustrating a wireless communication device in accordance with one embodiment of the present invention.

FIG. 2 is a schematic block diagram illustrating a wireless communication device that includes a host unit 30 and an associated radio unit 60. Host unit 30 may be incorporated in a communication device, such as one or more of the wireless communication devices 20-27 shown in FIG. 1. For cellular telephone hosts, radio 60 is typically a built-in component. For personal digital assistants hosts, laptop hosts, and/or personal computer hosts, radio 60 may be built-in or may be an externally coupled component that couples to host device 30 via a communication link, such as a PCI interface, PCMCIA interface, USB interface, or another type of interface.

As illustrated, host device 30 includes a processing module 50, memory 52, radio interface 54, input interface 58, and output interface 56. Processing module 50 and memory 52 execute corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For inbound data received from radio 60, radio interface 54 provides the data to processing module 50 for further processing and/or routing to output interface 56. Output interface 56 provides connectivity to an output display device 57, such as a display, monitor, speakers, et cetera, such that the received data may be displayed or otherwise output. Radio interface 54 also provides outbound data from processing module 50 to radio 60. Processing module 50 may receive the outbound data from an input device 59, such as a keyboard, keypad, microphone, et cetera, via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter (ADC) 66, a filtering/gain/attenuation module 68, an intermediate frequency (IF) mixing down conversion stage noted as down-conversion module 70, a receiver filter module 71, a low noise amplifier (LNA) 72, a transmitter/receiver (Tx/Rx) switch module 73, a local oscillation module 74, a memory 75, a digital transmitter processing module 76, a digital-to-analog converter (DAC) 78, a filtering/gain/attenuation module 80, an IF mixing up conversion stage noted as up-conversion module 82, a power amplifier (PA) 84, a transmitter filter module 85, and an antenna 86. The antenna 86 may be a single antenna that is shared by the transmit and receive paths as controlled by Tx/Rx switch 73, or may include separate antennae for the transmit path and receive path (shown by the dotted line). The antenna implementation may depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. Digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when processing module 64 and/or 76 implements one or more of its functions via a state machine, analog circuitry, digital circuitry, and/or logic circuitry, the memory storing the corresponding operational instructions may be embedded with the circuitry comprising the state machine, analog circuitry, digital circuitry, and/or logic circuitry. Memory 75 stores, and the processing module 64 and/or 76 executes, operational instructions that facilitate functionality of the device. In some embodiments, the combination of digital receiver processing module 64, digital transmitter processing module 76 and memory 75 may be referred to together as a "baseband processor."

In operation, radio 60 receives outbound data 94 from host 30 via host interface 62. Host interface 62 routes outbound data 94 to digital transmitter processing module 76, which processes outbound data 94 in accordance with a particular wireless communication standard (e.g., IEEE802.11a, IEEE802.11b, IEEE802.11g, Bluetooth, et cetera) to produce digital transmission formatted data 96. Digital transmission formatted data 96 is typically a digital base-band signal or a digital low IF signal, where the low IF typically may be in the frequency range of one hundred kilohertz to a few megahertz (MHz).

Digital-to-analog converter 78 converts digital transmission formatted data 96 from the digital domain to the analog domain. Filtering/gain/attenuation module 80 filters and/or adjusts the gain of the analog signal prior to providing it to up-conversion module 82 for mixing. Up-conversion module 82 directly converts the analog baseband or low IF signal into an RF signal based on a transmitter local oscillation (Tx LO) 83 provided by local oscillation module 74. Power amplifier 84 amplifies the RF signal to produce outbound RF signal 98, which is filtered by transmitter filter module 85. Antenna 86 propagates outbound RF signal 98 to a targeted device such as a base station, an access point and/or another wireless communication device.

Radio 60 also receives inbound RF signal 88 via antenna 86, which was transmitted by a base station, an access point, or another wireless communication device. Antenna 86 provides inbound RF signal 88 to receiver filter module 71 via Tx/Rx switch 73, where Rx filter 71 bandpass filters inbound RF signal 88. Rx filter 71 provides the filtered RF signal to low noise amplifier 72, which amplifies signal 88 to produce an amplified inbound RF signal. The low noise amplifier 72 provides the amplified inbound RF signal to down-conversion module 70, which directly converts the amplified inbound RF signal into an inbound low IF signal or baseband signal based on a receiver local oscillation (Rx LO) 81 provided by local oscillation module 74. Down-conversion module 70 provides the inbound low IF signal or baseband signal to filtering/gain/attenuation module 68. Filtering/gain/attenuation module 68 may be implemented to filter and/or attenuate the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to host device 30 via radio interface 54.

As one of ordinary skill in the art will appreciate, the particular wireless communication device of FIG. 2 may be implemented using one or more integrated circuits. For example, host 30 may be implemented on one integrated circuit and digital receiver processing module 64, digital transmitter processing module 76 and memory 75 may be implemented on a second integrated circuit, and the remaining components of radio 60, less the antenna 86, may be implemented on a third integrated circuit. As an alternative embodiment, radio 60 may be implemented on a single integrated circuit. As yet another alternative embodiment, processing module 50 of host 30 and digital receiver and transmitter processing modules 64 and 76 may be a common processing device implemented on a single integrated circuit. Further, memory 52 and memory 75 may be implemented on a single integrated circuit and/or on the same integrated circuit as the common processing modules of processing module 50 and digital receiver and transmitter processing module 64 and 76.

Figure 3:
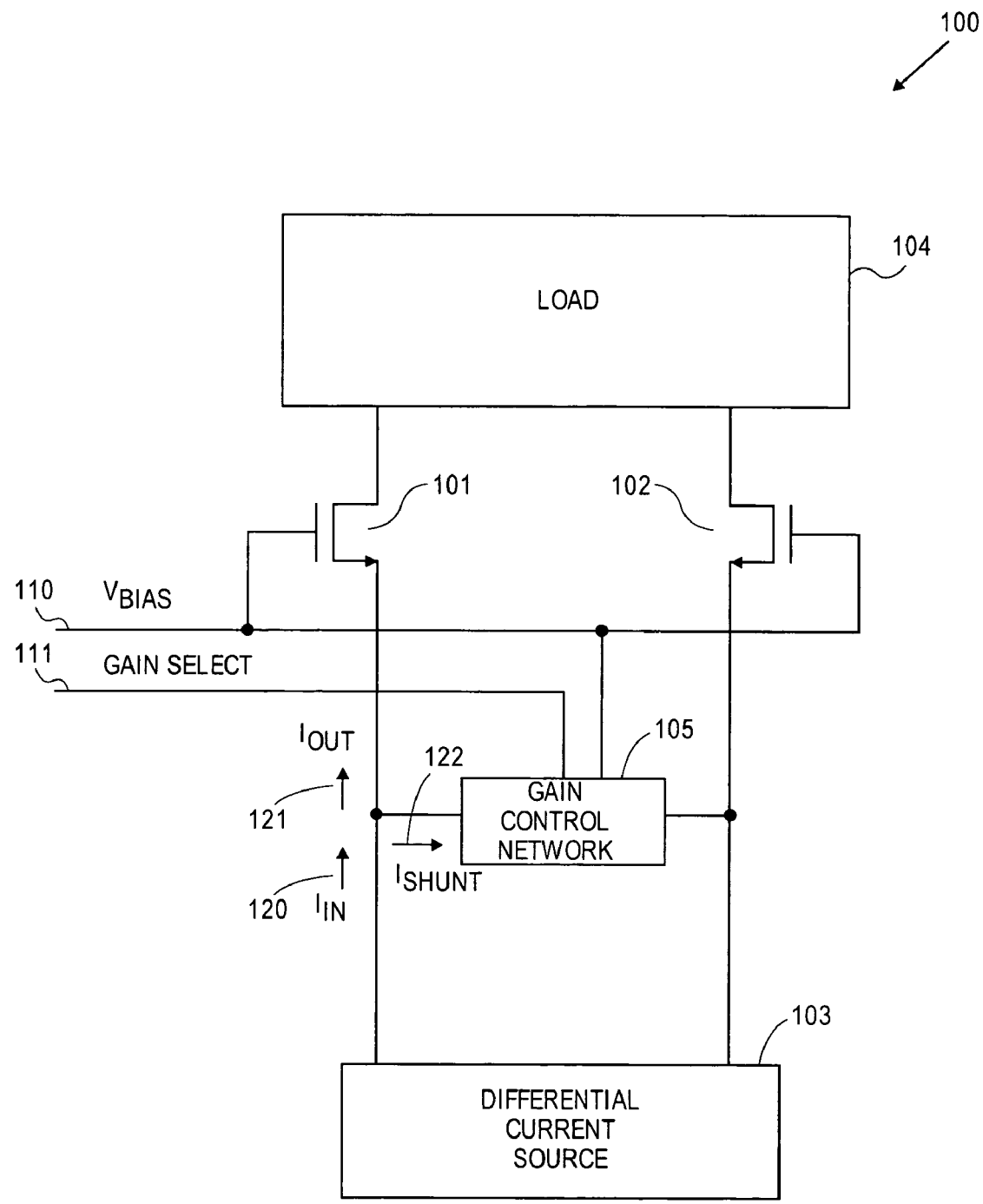
FIG. 3 is a block schematic diagram illustrating one embodiment of a gain control scheme disposed across source terminals of a differential amplifier stage.

FIG. 3 shows one embodiment of a circuit for practicing the present invention. FIG. 3 shows a circuit 100 that may be utilized to implement the gain control scheme of the present invention. Circuit 100 comprises a pair of cascode arranged transistors 101, 102, having a differential current source 103 coupled to their source terminals and a load 104 coupled to their drain terminals. A gain control network 105 is also coupled across the source terminals of transistors 101, 102. A bias voltage $V_{BIAS}$ 110 is coupled to gates of transistors 101, 102. In the particular embodiment shown, $V_{BIAS}$ is also coupled to gain control network 105, along with a GAIN SELECT signal 111.

Cascode transistors are utilized to provide a drive current to load 104. Load 104 may comprise a variety of circuitry or components and in one embodiment described further below, a mixer is implemented for load 104. Load 104 may be designed such that the amount of the differential drive current from transistors 101, 102 determines the amplification factor available to load 104. As noted in circuit 100, transistors 101, 102 are cascode transistors for receiving a differential current from current source 103. One leg of the differential current from current source 103 is shown as $I_{IN}$ 120. A portion of $I_{IN}$ is shunted to gain control network 105 and is shown as shunt current $I_{SHUNT}$. The remaining current $I_{OUT}$ 121 is coupled to transistor 101. Thus, gain control network 105 operates as a current divider, so that $I_{IN} = I_{SHUNT} + I_{OUT}$ Assuming that $I_{IN}$ stays substantially constant, adjusting the value of $I_{SHUNT}$ results in a proportional adjustment of $I_{OUT}$ in the opposite direction. Since $I_{OUT}$ is the drive current to the cascode transistors 101, 102, which differentially drive load 104, the value of $I_{OUT}$ may be used to set the amplification factor (gain) available. Gain control network 105 is used to directly set the value of $I_{SHUNT}$ and, therefore, indirectly set the value for $I_{OUT}$. Although gain control network 105 may be fixed, so that gain of circuit 100 is also fixed, one embodiment of the invention allows gain control network 105 to be adjustable, so that $I_{SHUNT}$ is adjustable. In one embodiment, a GAIN SELECT signal is used to select the value of $I_{SHUNT}$ and allow for the selection of a gain value for circuit 100. As will be noted below, in one embodiment, GAIN SELECT is made programmable so that gain may be programmably selected.

The bias voltage $V_{BIAS}$ is also coupled to gain control network 105 in circuit 100. Although a different bias voltage may be coupled to gain control network 105, one embodiment of circuit 100 applies the same $V_{BIAS}$ voltage on gates of shunt transistors of gain control network 105 in order to have the gate-to-source voltages of cascode transistors 101, 102 and current setting transistors of gain control network 105 to vary equivalently to compensate for variations caused by PVT.

Figure 4:
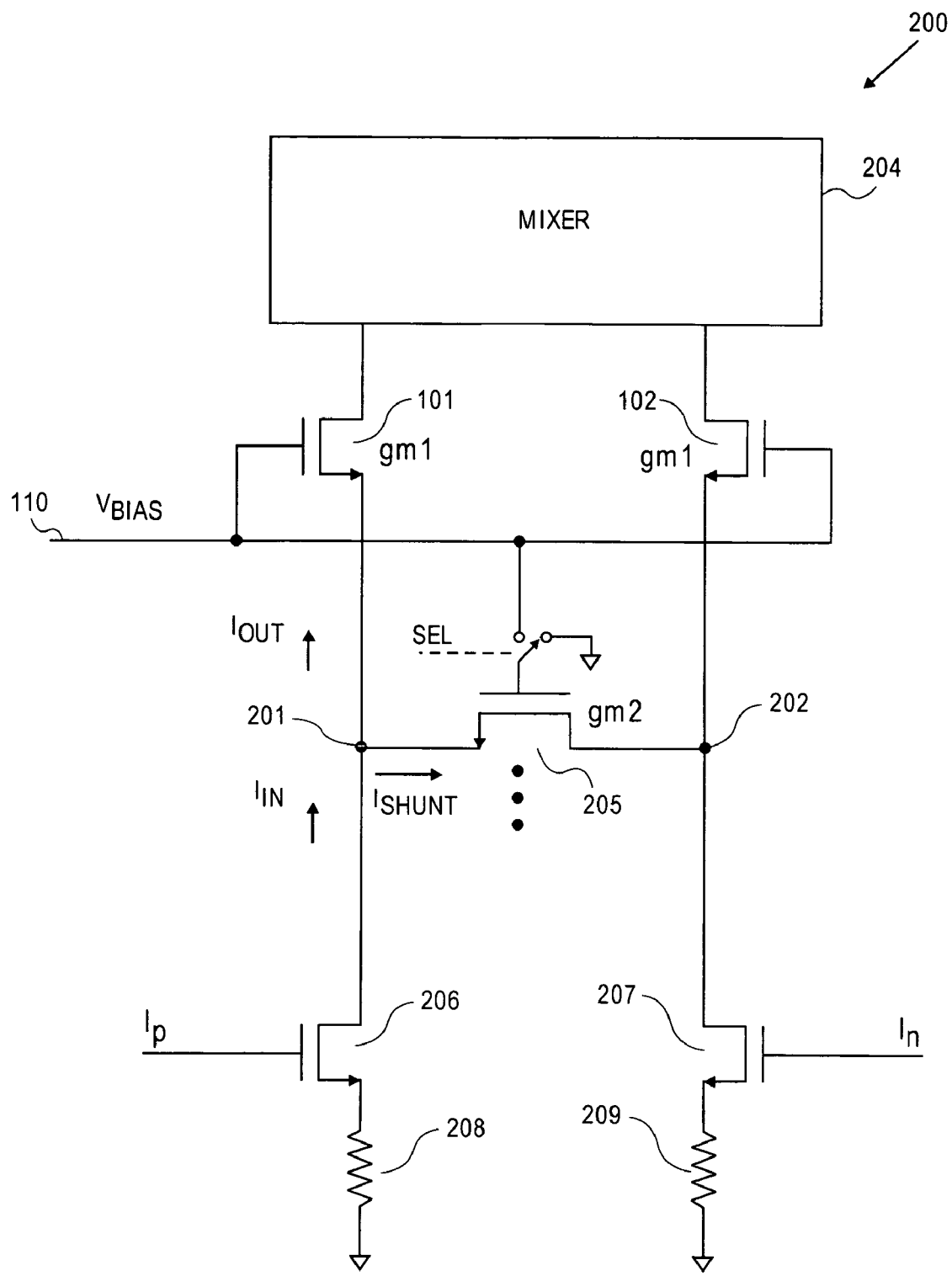
FIG. 4 is a circuit schematic diagram of one embodiment of a differential gain control circuit for the schematic diagram of FIG. 3, in which one or more shunt transistors are disposed across source terminals of cascode transistors and in which the same bias voltage is applied to gates of the cascode transistors as well as the one or more shunt transistors.

FIG. 4 shows one embodiment for implementing the circuit 100 of FIG. 3. In FIG. 4, a circuit 200 employs cascode transistors 101, 102 with their gates coupled to $V_{BIAS}$ 110. Load 104 of FIG. 3 is now shown as a mixer load 204. Although a variety of mixer circuits may be employed, in one embodiment, mixer load 204 is a Gilbert Cell mixer, in which current drive from transistors 101, 102 determines the gain of mixer 204. For differential current source 103 of FIG. 3, a variety of different types of current sources may be used, including current mirrors. For the embodiment of FIG. 4, current source 103 is represented by a pair of transistors 206, 207 and respective source resistors 208, 209. In this particular embodiment, transistors 206, 207 operate as transconductance devices so that differential voltage input signals $I_P$ and $I_N$ to the gates of transistors 206, 207, respectively, control drain currents of transistors 206, 207.

Gain control network 105 of FIG. 3 is now shown as one or more transistors 205 in circuit 200. Although only one transistor 205 is shown in FIG. 4, it is to be noted that there may be a plurality of transistors arranged across nodes 201 and 202. $I_{SHUNT}$ represents the amount of current flowing between nodes 201 and 202, whether there is only one active transistor or multiple active transistors across nodes 201, 202. In the particular embodiment of circuit 200, either $V_{BIAS}$ is applied to the gate of transistor 205 to turn on (activate) transistor 205 or ground is placed on the gate to turn off (deactivate) transistor 205. Signal SEL is used to control which potential is to be switched on to the gate of transistor 205. The SEL signal corresponds to the GAIN SELECT signal of FIG. 3 when multiple transistors 205 are present.

Figure 5:
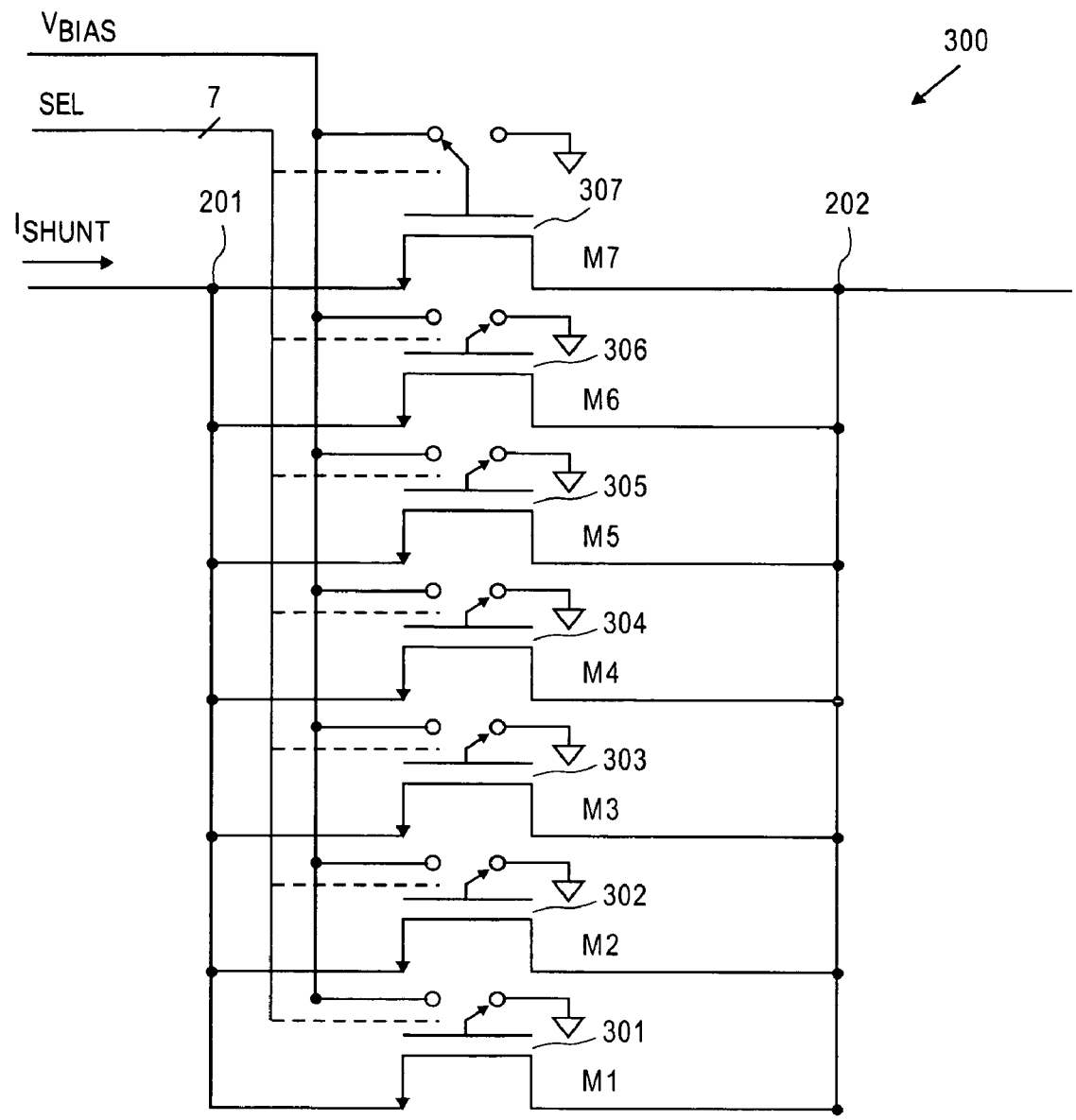
FIG. 5 is a circuit schematic diagram of an embodiment of a shunt transistor network used with the circuit of FIG. 4 to provide multiple attenuation factors that may be programmably controlled.

Also referring to FIG. 5, transistor network 300 shows one embodiment for implementing multiple transistors across nodes 201, 202. In the particular example, seven transistors 301-307 (also noted as M1-M7) are shown arranged in parallel across nodes 201, 202. Transistors M1-M7 comprise gain control network 105 of FIG. 3. The gates of M1-M7 are individually controlled by separate SEL signals so that each transistor activation may be controlled separately. In the particular example illustrated for network 300, M7 is shown in the activated position with $V_{BIAS}$ applied to the gate of M7, while the remaining transistors M1-M6 are shown in the deactivated state with the gates coupled to ground. The particular example of FIG. 5 shows the gates coupled to ground, but other embodiments may couple the gates to a low voltage that turns off the transistors M1-M7.

Since the amount of current flow between nodes 201, 202 is determined by the number of transistors in the turn-on state, $I_{SHUNT}$ is minimum when all transistors M1-M7 are off and $I_{SHUNT}$ is maximum when all transistors M1-M7 are on. Furthermore, since $I_{SHUNT}$ is inversely proportional to $I_{OUT}$ due to the current division of $I_{IN}$, maximum gain is obtained from circuit 200 when M1-M7 are off and minimum gain is obtained from circuit 200 when M1-M7 are all on. Intermediate gain ranges may be obtained by selectively activating/deactivating various combinations of M1-M7. Thus, by selectively turning on various transistors M1-M7, gain attenuation may be achieved in steps by increasing $I_{SHUNT}$ accordingly.

The SEL signal may be programmable, so that various gain settings may be programmed. The activation/deactivation of M1-M7 is shown by manipulation of switches at the gates of M1-M7 for simplicity. However, various mechanisms may be used to apply voltages to the gates of M1-M7. Furthermore, the switching may be achieved remotely and not necessarily at the gate location of M1-M7, as shown.

Although various activation schemes may be implemented, one embodiment uses a sequential activation technique. In this technique, initial gain setting is set with only M7 turned on. The next lower gain setting is achieved by activating a second transistor, such as M6, so that both M6 and M7 are on. The subsequent lower gain settings are achieved by turning on an additional transistor at each step, until a lowest gain setting is achieved when M1-M7 are all on. As noted, this is one technique and many other sequences may be employed to establish the various gain settings.

Furthermore, the gain settings may be controlled by sizing the transistors. In some embodiments, all the shunt transistors may have the same characteristics, but in other embodiments, different characteristics may be attributed to the transistors. For example, some or all of the shunt transistors may be of different sizing. Thus, various design options are available to set the current values through the shunt transistors.

It is to be noted that with circuit 200, $V_{BIAS}$ is also coupled to the gates of M1-M7 to activate M1-M7. One advantage of applying $V_{BIAS}$ to transistors 101, 102 and the shunt transistors M1-M7 is that the gate-to-source voltage (Vgs) of these transistors are the same. Thus, any variations that are noted by these transistors affect the transistors in an equivalent manner, so that the transistors track each other. Accordingly, circuit variations that cause a change in $I_{SHUNT}$ also affect $I_{OUT}$ in an equivalent manner, so that the overall change is negligible. In effect, PVT variations of these transistors cancel themselves so that the overall current division at node 201, 202 remains substantially the same.

For example, if transistors 101 and 102 have a transconductance value noted as gm1 and transistor 205 has a transconductance value of gm2, the relationship of $I_{OUT}$ to $I_{IN}$ may be expressed by:

$$I_{out} = I_{in} \times \frac{\frac{1}{2} \times \frac{1}{gm2}}{\frac{1}{2} \times \frac{1}{gm2} + \frac{1}{gm1}}$$

The transconductance value gm1 may be expressed by:

$$\frac{1}{gm1} = \frac{1}{\mu_n C_{OX} \frac{W}{L}(V_{bias} - V_{th})}$$

where $\mu_n$ is the carrier mobility, $C_{OX}$ is the oxide capacitance of the transistor, W and L are the width and length dimensions of the transistor and Vth is the threshold voltage of the transistor 101, 102.

The transconductance value of gm2 may be expressed by:

$$\frac{1}{gm2} = \frac{1}{\mu_n C_{OX} \frac{W}{L}(V_{bias} - V_{th} - V_{DS})}, V_{DS} \cong 0$$

in which $V_{DS}$ is deemed negligible for the shunt transistor (e.g. transistor 205).

The equations show that the current division at the node 201, as well as 202, is dependent strictly on the transconductance values gm1 and gm2, at least for the first order equations, and not on the transistor parameters which are affected by PVT. Thus, with circuit 200, when $V_{BIAS}$ is also coupled to the gates of the shunt transistors, PVT variations have minimal impact on the current division at nodes 201, 202. It is to be noted that in one embodiment, the shunt transistor or transistors operate in a triode region. That is, the shunt transistor 205 operates as a resistor such that the current relationship with respect to its drain-to-source voltage is linear. Accordingly, in some instances it is possible for the shunt transistors to operate with other than $V_{BIAS}$ applied to the gates of the shunt transistors.

Figure 6:
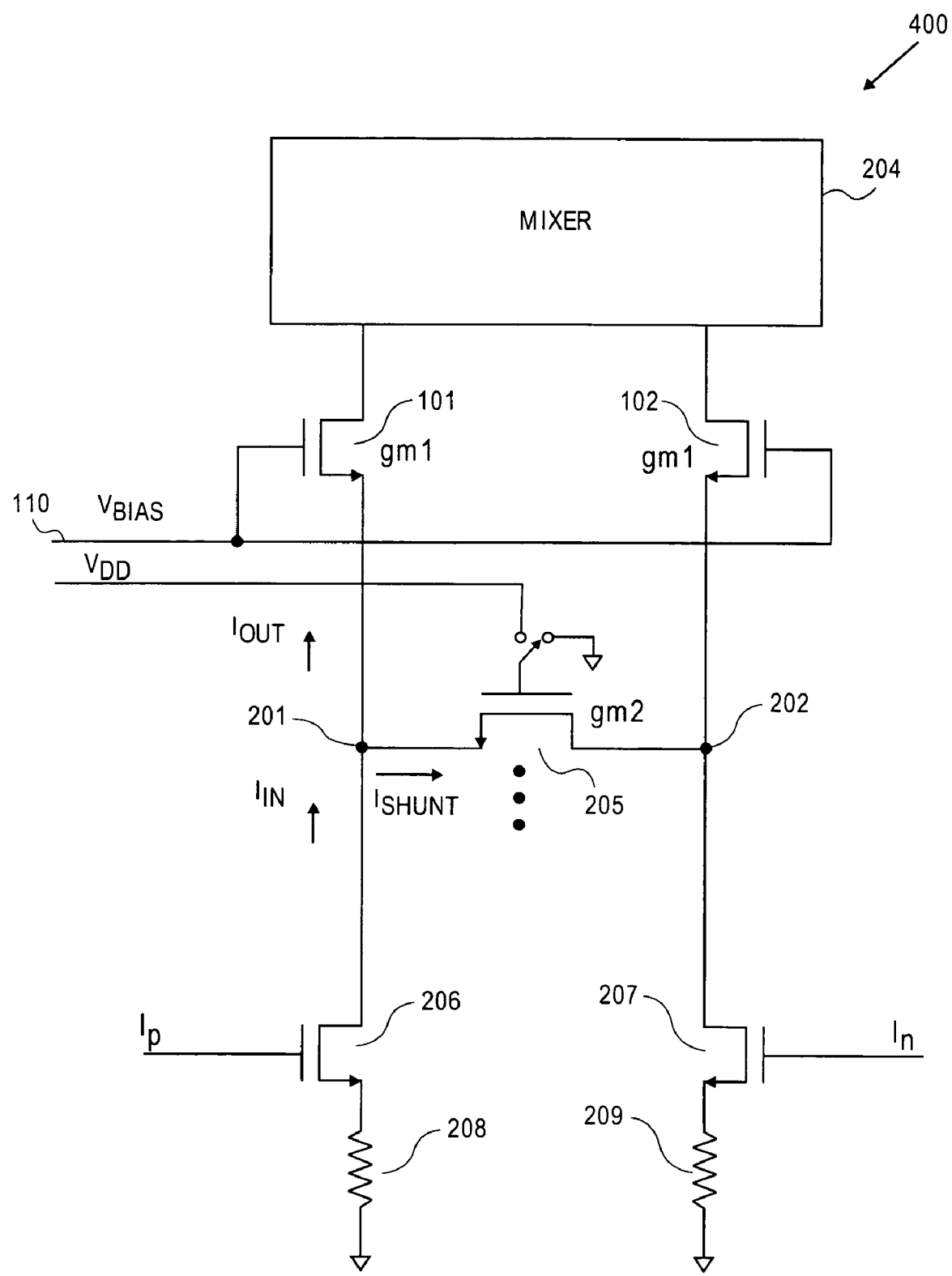
FIG. 6 is a circuit schematic diagram of another embodiment of a differential gain control circuit for the schematic diagram of FIG. 3, in which one or more shunt transistors are disposed across source terminals of cascode transistors, bit in which a bias voltage applied to gates of the shunt transistors is different than the bias voltage applied to gates of the cascode transistors.

FIG. 6 shows a circuit 400 which utilizes a gate bias voltage other than $V_{BIAS}$ on the gate of the shunt transistor 205. Again, although one shunt transistor is shown, multiple shunt transistors may be present. Circuit 400 is equivalent to circuit 200 of FIG. 4, except that a different bias voltage is coupled to the gate(s) of the shunt transistor(s). In the particular embodiment, supply voltage Vdd is applied to the shunt transistor(s), instead of $V_{BIAS}$. Circuit 400 still allows for gain control by controlling $I_{SHUNT}$, however, the immunity to PVT variations is much less since $V_{BIAS}$ is not applied to the shunt transistor(s). Circuit 400 is an alternative embodiment that may be used when PVT variation is not significant or of concern.

Figure 7:
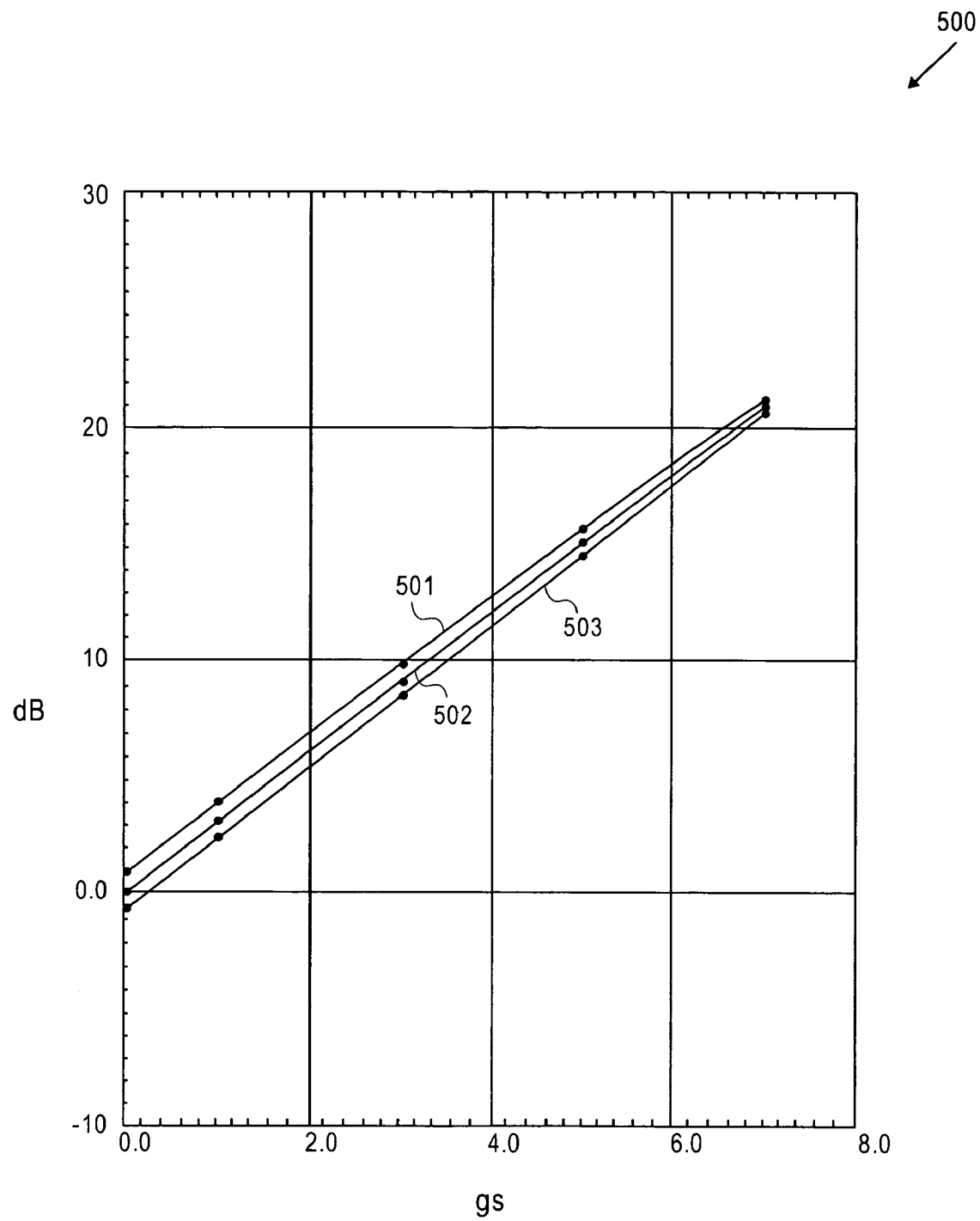
FIG. 7 is a graph illustrating one circuit response to the circuit of FIG. 4.
Figure 8:
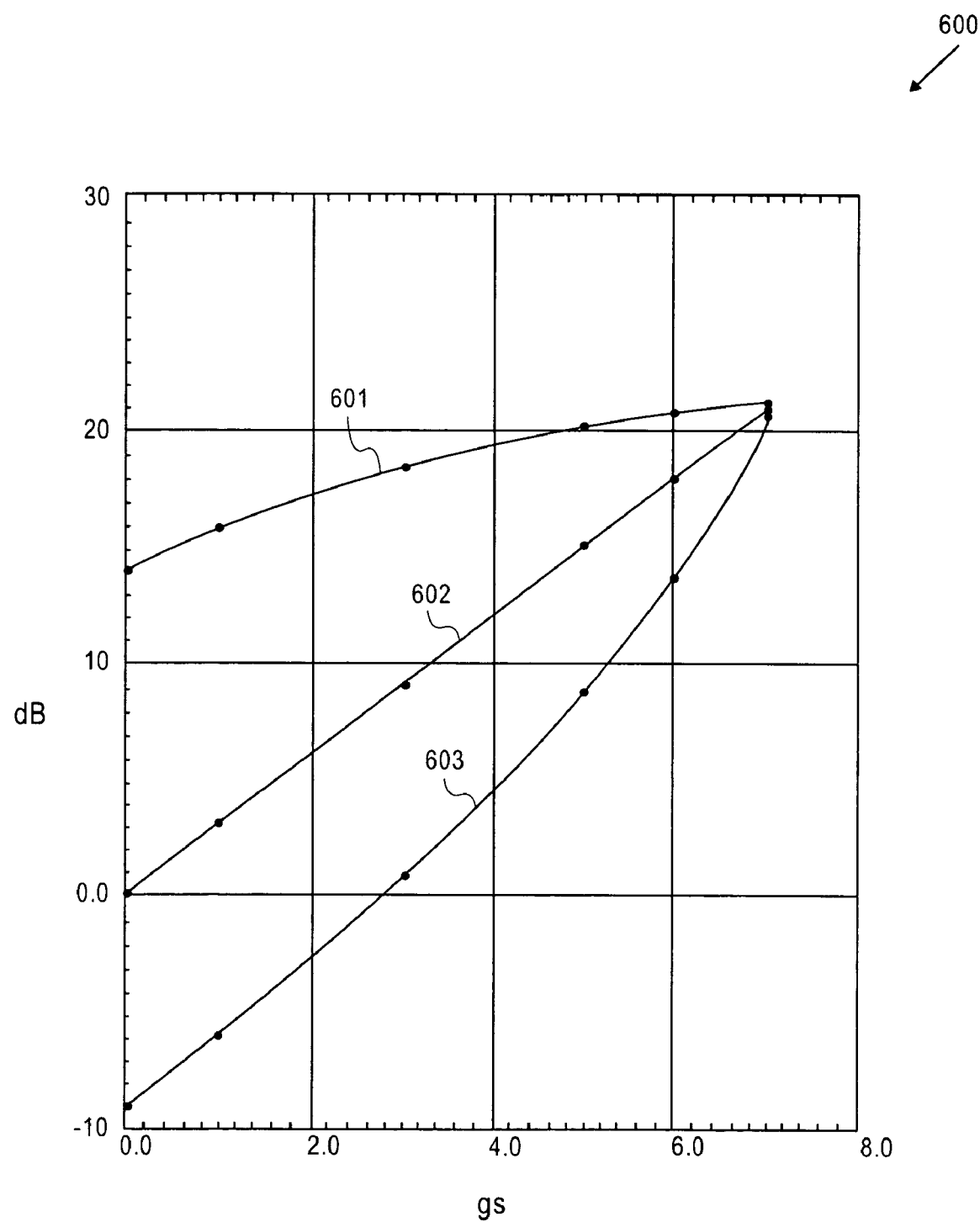
FIG. 8 is a graph illustrating one circuit response to the circuit of FIG. 6.

Referring to FIGS. 7 and 8, although many circuit responses are possible, two example responses to variations in PVT are shown in reference to circuits 200 and 400. In FIG. 7, a plot of gain (dB) vs. gain select (gs) is shown for three PVT conditions as implemented in circuit 200 (or alternatively circuit 400). The gs values correspond to a decoded 3-bit select signal, where bit values 000-111 (values 0.0-7.0) are decoded to activate 0, 1, 2, 3, 4, 5, 6 or 7 shunt transistors, such as M1-M7. Graph 500 shows sets of points to establish curves 501, 502 and 503. Curve 501 exemplifies a worst case PVT condition having a highest temperature (100° C.), lowest supply voltage and slowest process. Curve 502 exemplifies a typically experienced average PVT condition at approximately 27° C. (room temperature). Curve 503 exemplifies a best case PVT condition having a lowest temperature (−20° C.), highest supply voltage and fastest process. As shown, the three curves are very close to one another over a significant PVT variation.

In FIG. 8, a similar plot is shown for the three PVT conditions when PVT immunity is not implemented. In this instance graph 600 shows responses plotted by curves 601, 602 and 603, corresponding to conditions noted for curves 501, 502 and 503, respectively. As shown, without PVT immunity, the three curves 601-603 are farther apart from one another as compared to the curves 501-503 of FIG. 7.

Therefore, both circuits 200 and 400 may be utilized to provide gain control for the load, but the advantage of circuit 200 is its ability to compensate for variations in PVT. It is to be noted that embodiments of the invention may be employed in various devices and, more specifically, may be employed in one or more of the components shown in FIGS. 1 and 2. For example, embodiments of the invention may be implemented in modules 80, 82 of FIG. 2. Alternatively, embodiments of the invention may be implemented in modules 68, 70 of FIG. 2.

Thus, a gain control scheme is described in which a shunt network is used to control $I_{SHUNT}$ to attenuate the drive current $I_{OUT}$ to control gain. With proper coupling of the gates of the cascode transistors to the gate(s) of the shunt transistor(s), the circuit may be made independent of process, voltage and temperature and substantially immune to these effects.

Additionally, although particular embodiments of the invention are described and illustrated herein, other embodiments are readily available. For example, although n-type transistors are illustrated in the Figures, equivalent circuits may be designed using p-type devices.

We claim:

1. An apparatus comprising:
a driver having at least a pair of transistors disposed in a cascode arrangement having their gate terminals coupled together to receive a bias voltage and their source terminals coupled to receive differential driver current; and
a shunt network coupled across the source terminals of the pair of cascode transistors to operate as a current divider to divert a portion of the differential driver current away from the pair of cascode transistors, in which an amount of current diverted to the shunt network operates to control gain of the driver, and in which the shunt network includes at least one shunt transistor that has its gate terminal coupled to the bias voltage to activate the at least one shunt transistor, the coupling of the gates of the pair of cascode transistors and the gate of the at least one shunt transistor to the same bias voltage cancels circuit variations of the driver that are due to effects of process, voltage and temperature.

2. The apparatus of claim 1 wherein the shunt network includes a plurality of shunt transistors, in which the bias voltage is switched to a gate terminal of each respective shunt transistor when the respective shunt transistors are selected to activate and activation of particular transistor or transistors determine the amount of current diverted to allow different gain settings to be selected for the driver, and wherein coupling of the gates of the pair of cascode transistors and the gates of the shunt transistors together to the same bias voltage cancels circuit variations of the driver that are due to effects of process, voltage and temperature.

3. The apparatus of claim 2, wherein the plurality of shunt transistors are programmable to select different gain settings for the driver.

4. An apparatus comprising:
a driver having at least a pair of transistors disposed in a cascode arrangement having their gate terminals coupled together to receive a bias voltage, their source terminals coupled to receive differential driver current and their drain terminals coupled to a load; and a gain control network coupled across the source terminals of the pair of cascode transistors to operate as a current divider to divert a portion of the differential driver current away from the pair of cascode transistors, in which an amount of current diverted operates to control gain of the driver, the gain control network includes at least one shunt transistor that has its gate terminal coupled to the bias voltage to activate at least one shunt transistor, the coupling of the gates of the pair of cascode transistors and the gate of the at least one shunt transistor to the same bias voltage cancels circuit variations of the driver that are due to effects of process, voltage and temperature.

5. The apparatus of claim 4 wherein the at least one shunt transistor is actually a plurality of shunt transistors, in which a gate terminal of each respective shunt transistor is to be switched to the bias voltage to activate one or more of the respective shunt transistors and activation of particular transistor or transistors determine the amount of current diverted to allow different gain settings to be selected for the driver, the coupling of the gates of the pair of cascode transistors and the gates of the shunt transistors together to the same bias voltage cancels circuit variations of the driver that are due to effects of process, voltage and temperature.

6. The apparatus of claim 5 wherein the plurality of shunt transistors are programmable to select different gain settings for the driver.

7. The apparatus of claim 6 wherein the load coupled to the driver is a mixer.

8. The apparatus of claim 5 further comprising a pair of transconductance transistors coupled to generate the differential driver current to the driver.

9. The apparatus of claim 8 wherein the load coupled to the driver is a mixer.

10. The apparatus of claim 6 wherein maximum gain for the driver is obtained by having none of the shunt transistors active and gain is selectively reduced in steps by activating transistors in sequence.

11. The apparatus of claim 10 wherein the plurality of shunt transistors operate in a linear mode of operation to divert the differential current.

12. A method comprising:

driving a differential current into source terminals of a pair of transistors disposed in a cascode arrangement and in which a load is coupled to drain terminals of the pair of transistors;

providing a bias voltage to gate terminals of the pair of transistors;

activating a gain control network coupled across the source terminals of the pair of cascode transistors by selecting one or more transistors from a plurality of shunt transistors to be switched on for activation, in which a gain setting for driving the load is obtained by programmably selecting particular shunt transistor or transistors for activation;

providing the bias voltage to activate one or more of the shunt transistors and in which coupling of the gates of the pair of cascode transistors and gates of the shunt transistors that are activated to the same bias voltage cancels circuit variations that are due to effects of process, voltage and temperature; and diverting a portion of the differential current away from the pair of cascode transistors into the gain control network, in which an amount of current diverted operates to control gain of a driver driving the load.

13. The method of claim 12 wherein driving the differential current into the source terminals of the pair of cascode transistors is achieved by a pair of transconductance transistors coupled to generate the differential current.

14. The method of claim 13 further comprising driving the load with a remaining portion of the differential current that is not diverted into the gain control network.

15. The method of claim 14 wherein driving the load includes driving a mixer.

* * * * *